United States Patent [19]

Frohman-Bentchkowsky

[11] 3,755,721

[45] Aug. 28, 1973

[54] FLOATING GATE SOLID STATE STORAGE DEVICE AND METHOD FOR CHARGING AND DISCHARGING SAME

[75] Inventor: Dov Frohman-Bentchkowsky, Los Altos, Calif.,

[73] Assignee: Intel Corporation, Mountain View, Calif.

[22] Filed: Jan. 15, 1971

[21] Appl. No.: 106,642

Related U.S. Application Data

[63] Continuation-in-part of Ser. No. 46,148, June 15, 1970, Pat. No. 3,660,819.

[52] U.S. Cl. .......................... 317/235 R, 317/235 B

[51] Int. Cl. .......................................... H01l 11/14

[58] Field of Search ...................... 317/235 B, 235 G

[56] References Cited

UNITED STATES PATENTS

| | | | |
|---|---|---|---|
| 3,060,327 | 10/1962 | Dacey | 317/235 |
| 3,321,680 | 5/1967 | Arndt et al. | 317/235 |
| 3,339,086 | 8/1967 | Shockley | 317/235 |
| 3,401,319 | 9/1968 | Watkins | 317/235 |
| 3,500,142 | 3/1970 | Kahrg | 317/235 |
| 3,577,210 | 5/1971 | Dill | 317/235 |

FOREIGN PATENTS OR APPLICATIONS

| | | | |
|---|---|---|---|
| 813,537 | 5/1969 | Canada | 317/235 |

OTHER PUBLICATIONS

Applied Physics Letters, "Avalanche Injection Currents and Charging Phenomena in Thermal $SiO_2$" by Nicollian et al., Vol. 15, No. 15, Sept. 1969, pages 174–176.

IBM Tech. Discl. Bul., "Electron-Beam Testing Apparatus For Integrated Circuits" by Walker et al., Vol. 10, No. 2, July 1967, pages 175–176.

*Primary Examiner*—Jerry D. Craig
*Attorney*—Spensley, Horn & Lubitz

[57] ABSTRACT

A floating gate solid state storage device comprising a floating silicon or metal gate in a field effect device which is particularly useful in integrated circuit devices such as a read-only memory is disclosed. The gate which is surrounded by an insulative material such as $SiO_2$ is charged by transferring charged particles (i.e., electrons) at relatively low voltages (e.g., less than approximately 50 volts) across a thick insulation layer (e.g., greater than approximately 500 angstroms) from the substrate during an avalanche injection condition.

9 Claims, 7 Drawing Figures

DOV FROHMAN-BENTCHKOWSKY
INVENTOR.

BY Spensley, Horn & Lubitz
ATTORNEYS

DOV FROHMAN-BENTCHKOWSKY
INVENTOR.

BY Spensley, Horn & Lubitz
ATTORNEYS

DOV FROHMAN-BENTCHKOWSKY
INVENTOR

BY Spensley, Horn, & Lubitz
ATTORNEYS

FLOATING GATE SOLID STATE STORAGE DEVICE AND METHOD FOR CHARGING AND DISCHARGING SAME

This application is a continuation-in-part of application Ser. No. 46,148, filed June 15, 1970, now U.S. Pat. No. 3,660,819.

BACKGROUND OF THE INVENTION

1. Field of the Invention

The invention relates to the field of solid state storage devices having a floating gate.

2. Prior Art

In the prior art, there has been suggested the use of a field effect device having a floating metal gate for use as a memory element in a read only memory array. The floating gate in the memory array is either electrically charged or not charged and used in a similar fashion to other bi-stable devices such as magnetic cores, flip-flops, etc. A reference to the use of a floating metal gate in a field effect device is made in "A Floating Gate and Its Application to Memory Devices," Bell Systems Technical Journal, 46, 1283 (1967) by D. Khang and S.M. Sze.

The floating gate has not been used in memory devices since the prior art technology has not disclosed a practical embodiment of a floating gate device. FIG. 1 illustrates a typical prior art embodiment of a floating gate device; its impracticalities will be discussed in conjunction with that figure.

SUMMARY OF THE INVENTION

A solid state storage device which in its presently preferred embodiment comprises a floating gate insulator semiconductor device is described, The transistor comprises a substrate of a first conductivity type and a pair of spaced apart regions of the opposite conductivity type to the first conductivity type disposed in the substrate. A gate is spatially disposed between the regions and separated therefrom by an insulative layer. The gate is substantially surrounded by an insulative layer that may be of the same type that separates it from the region or a different type and no electrical connections are made to the gate. Contact means such as metal contacts are provided to the regions. In the presently preferred embodiment of the invention, the substrate comprises an n-type silicon and the regions are of a p-type conductivity. The gate may be semiconductor materials such as silicon or germanium or conductive metals such as aluminum or molybdenum.

An electrical charge is placed on the gate by applying a voltage between one of the regions and the substrate of sufficient magnitude to cause a breakdown (e.g., an avalanche injection condition) in at least one of the junctions defined by the interface of the regions and substrate. This causes electrons to enter and pass through the insulation separating the substrate and gate and to charge the gate. The charge may be removed from the gate by subjecting the transistor to X-rays or to ultra-violet light.

It is an object of the present invention to provide a floating gate solid state storage device which is easy to manufacture and which may be manufactured utilizing proven processes.

It is still another object of the present invention to provide a floating gate solid state storage device which is particularly adaptable for use with a silicon gate.

Another object of the present invention is to provide a storage retention device without the continuous application of power.

It is still further object of the present invention to provide a method for charging a floating gate utilizing relatively low electric fields and voltage across the insulator, thereby preventing the destructive breakdown of the insulation which surrounds the floating gate.

DETAILED DESCRIPTION OF THE INVENTION

A field effect device having a floating gate which is particularly useful as a component in a read-only memory is disclosed. The presence or lack of an electrical charge on the gate is sensed and this information used in the same manner as other bi-stable memory devices such as magnetic cores and flip-flops are used in forming a memory array. Once the gate of the device is charged, the charge remains permanently (10 years at 125° C) on the gate and the existence or non-existence of the charge on the gate is readily ascertainable by sensing the conductivity characteristics between the source and drain region of the field effect transistor. Typically, the field effect transistor readily conducts a current between its source and drain once the gate is negatively charged and likewise the transistor will not conduct a current when the gate is not charged assuming that the voltage applied to the source or drain junction is less than that required to cause an avalanche breakdown in the transistor.

Figure 1:
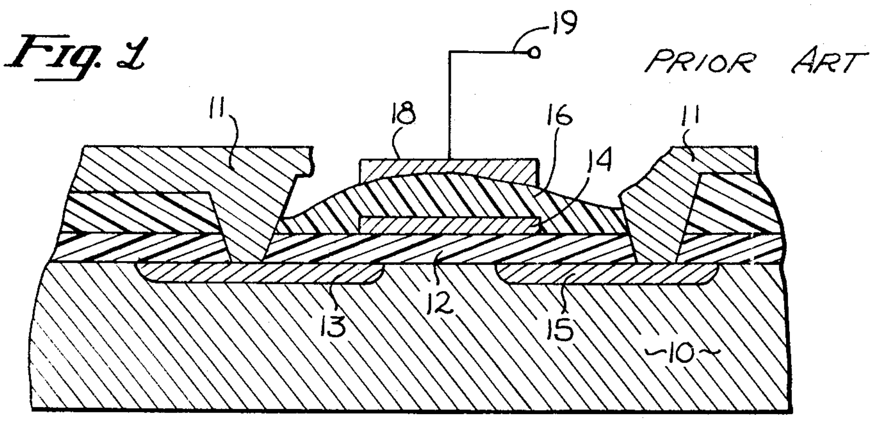
FIG. 1 illustrates a cross-section of a floating gate device as disclosed in the prior art.

Referring to FIG. 1, a floating gate deivce as known in the prior art is illustrated. The device comprises a field effect device having a source and drain hereafter interchangeably referred to as regions 13 and 15 which are produced in a substrate 10. The substrate 10 is opposite in conductivity type to the regions 13 and 15. For example, if the substrate 10 is an n-conductivity type, the regions 13 and 15 would be a p-conductivity type. Metal contacts 11 are coupled to the regions 13 and 15 to allow a current to be passed between the regions 13 and 15. An insulative layer 12 separates the floating gate 14 from the substrate 10 and regions 13 and 15. A second insulative layer 16 which serves to completely surround the floating gate 14, separates the charging gate 18 from the remainder of the transistor device. The gates 14 and 18 are made of material such as aluminum, the regions 13 and 15 and substrate 10 may be made from such material as appropriately doped silicon or germanium.

In the operation of the transistor of FIG. 1, a charge, if one is desired, is placed on the floating gate 14, by applying a voltage between the charging gate 18 via lead 19 and substrate 10. A charge is transported from the substrate across the insulation 12 into the floating gate 14. In order for a charge to be thusly transported without applying a voltage large enough to permanently breakdown the insulative materials 12 or 16, it is necessary that layer 12 be relatively thin and that a high ratio of dielectric constants exist between the materials used for layers 16 and 12. This produces a higher field strength across layer 12 than layer 16 and allows a charge to be transported by tunneling onto the gate 14. In practice, in addition to the difficulty of producing a uniform thin insulation, it is very difficult to deposit a metal layer over this thin insulation without producing current paths between the metal and substrate. Also, to achieve the high ratio of dielectric constants, a single insulative material such as silicon dioxide cannot be used for both layers 12 and 16. Thus, the device illustrated in FIG. 1 is not very useful since the above described restraints make it impractical to produce with presently known techniques.

Figure 2:
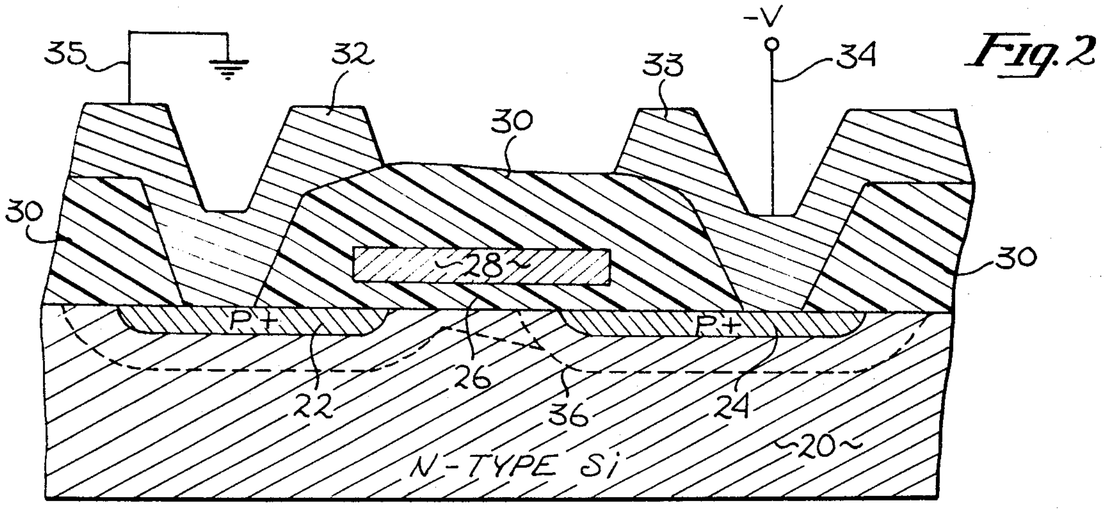
FIG. 2 illustrates a cross-section of a floating gate device as described by the present invention.

In FIG. 2, a cross-sectional view of a field effect storage device built in accordance with the teachings of the present invention is illustrated. While the present invention is illustrated in conjunction with a particular field-effect device, it is readily apparent that other types of field-effect transistors may be modified in accordance with the teachings of this patent and utilized as a component in a read-only array as well as in other applications. The device of FIG. 2 comprises a pair of spaced apart regions 22 and 24 (source and drain) which are opposite in conductivity type to the substrate 20. The regions which define a pair of p-n junctions, one between each region and the substrate may be produced on the substrate 20 utilizing commonly known techniques. The gate 28 of the device which is spatially disposed between the regions 22 and 24 preferably completely enclosed within insulative layers 26 and 30, so that no electrical path exists between the gate 28 and any other parts of the transistor. Metal contacts 32 and 33 are utilized to provide contacts to the regions 22 and 24, respectively. The device of FIG. 2 may be produced using known MOS or silicon gate technology.

In the present preferred embodiment of the invention, the substrate comprises an n-type silicon, the regions 22 and 24 comprise p-type regions, the contacts 32 and 33 are aluminum and the gate 28, which may be compatible conductive materials such as aluminum, comprises silicon. The insulative layer 26 and layer 30 may comprise a silicon oxide (e.g., SiO, $SiO_2$). For a more thorough discussion of the silicon gate technology, see IEEE Spectrum, Oct., 1969, *Silicon-Gate Technology*, page 28, Vadasz, Moore, Grove and Rowe.

As was previously noted, the insulative layer 12 of the device illustrated in FIG. 1 had to be relatively thin in order to charge the gate 14. With the devices of FIG. 2, the insulative layer 26 which separates the gate 28 from the substrate 20 may be relatively thick; for example, it may be 500 A to 1,000 A. This thickness may be readily achieved utilizing present MOS technology. The layer 30 in the presently preferred embodiment comprises approximately 1,000 A of the thermally grown silicon oxide directly above the gate 28 and approximately 1.0 $\mu$ of vapor deposited silicon oxide above the thermal oxide.

Unlike the device of FIG. 1, the gate 28 of the device of FIG. 2 may be charged in accordance with the teachings of the present invention without the use of a charging gate, such as gate 18 of FIG. 1. The charge is placed on the gate 28 through the metal contacts 32, 33 and the substrate. The charge is transferred to the gate 28 through the insulative layer 26 by causing an avalanche breakdown condition in either of the p-n junctions defined by regions 22 and 24 in the substrate 20. In FIG. 2, region 22 is illustrated coupled to the ground via the contact 32 and lead 35 and region 24 is illustrated coupled to a negative voltage via contact 33 and lead 34; also, the substrate is grounded. To charge the gate 28, a voltage is applied to lead 34 of sufficient magnitude to cause an avalanche breakdown of the junction defined by region 24 and substrate 20. When the avalanche breakdown occurs, the high energy electrons generated in this p-n junction depletion region pass through the insulative layer 26 onto the gate 28 under the influence of the fringing field. Once the gate 28 is charged, it will remain charged for usefully long periods since no discharge path is available for the accumulated electrons within gate 28. (Note that the entire gate 28 is surrounded by an insulative layer such as a thermal oxide.) After the voltage has been removed from the device, the only other electric field in the structure is due to the accumulated electron charge within the gate 28 and this is not sufficient to cause charge to be transported across the insulative layer 26. (Note that the gate 28 could have been charged in the same manner as described with the substrate and/or contact 32 biased at some potential other than the ground potential.)

Theoretical calculations have indicated that a charge on a gate such as gate 28 should remain there for periods greater than 10 years even at operating temperatures of 125° C. Typically, the avalanche junction breakdown described occurs at a voltage of approximately 30 volts utilizing typical MOS devices and assuming an oxide thickness for layer 26 of approximately 1,000 A. In a typical read-only memory, the existence or non-existence of a charge on gate 28 may be determined by examining the characteristics of the transistors at the contacts 32 and 33. This may be done by applying a voltage between contacts 32 and 33. This voltage should be less than that required to cause an avalanche breakdown. The transistor more readily conducts if a charge exists on gate 28 when compared to the conducting of the same device without a charge on its gate. For a more complete analysis of the phenomena involved in the avalanche injection of electrons, see E. H. Nicollian, A. Goetzberger and C. N. Berglund, "*Avalanche Injection Current and Charging Phenomena in Thermal $SiO_2$*", Applied Physics Letters 15, 174 (1969).

Figure 3:
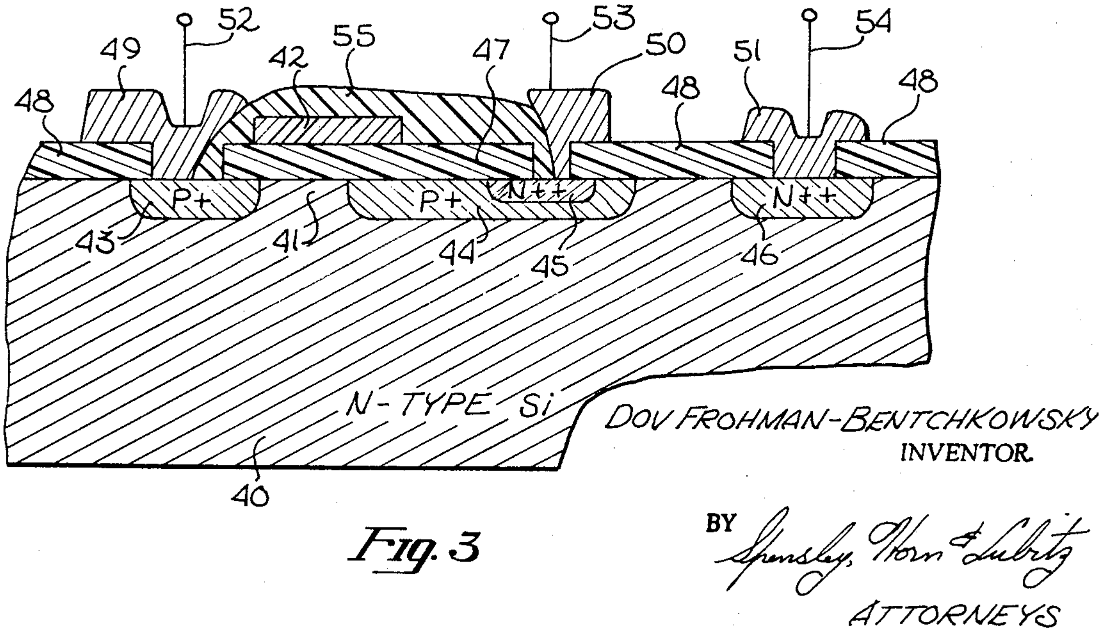
FIG. 3 is a cross-sectional view of an alternate embodiment of the present invention wherein a bipolar transistor is illustrated.

In FIG. 3, an npn bipolar transistor built in accordance with the present invention which may be utilized as an electrically programmable storage device is illustrated. The transistor in the presently preferred embodiment is illustrated on an n-type silicon substrate 40. Portions of this device are similar to the previously discussed device (FIG. 2) and may be manufactured utilizing similar techniques. Like the previous device, there is a first and second region of opposite conductivity types to the substrate 40 defining a channel 41. The first region 43 disposed in substrate 40 in a p+ region which is similar to the source region of the previously discussed embodiment; in the present transistor region 44 represents the base of the npn transistor. The second region 44 which may be a p+ region is also disposed within the substrate 40. A third region 45 disposed within the p+ region 44 is an n++ region and forms the emitter of the bipolar transistor. A fourth n++ region 46, spaced apart from regions 43 and 45, is disposed within the n-type substrate 40 and forms part of the collector of the transistor. Regions 43, 44, 45 and 46 may be formed in the n-type substrate utilizing known semiconductor fabrication techniques.

A floating gate 42 is disposed above and insulated from the channel 41. Gate 42 may be a metal or a p+ silicon gate as previously discussed. The floating gate 42 is insulated from regions 43 and 44 and channel 41 by insulation 47. In the presently preferred embodiment, this insulation is a silicon-oxide having a thickness of approximately 1,000 A. Insulation 55, which may also be a silicon-oxide, is disposed above the floating gate 42 such that the floating gate is completely surrounded by the insulation 47 and 55.

Contacts 49, 50, and 51 are coupled to regions 43, 45 and 46, respectively. These contacts which may be aluminum or other metals may be produced on the transistor utilizing known techniques. Leads 52, 53 and 54 are coupled to the contacts 49, 50 and 51, respectively. Insulative layer 48 is disposed along the upper surface of the substrate to confine the contacts to the desired regions and to protect the surface of the device. The insulative layer 48 in the presently preferred embodiment is a silicon-oxide.

In order to place a charge on the floating gate 42 of the bipolar transistor, a negative voltage is applied to lead 53 while lead 52 is grounded. The voltage should be of sufficient magnitude to cause a breakdown (e.g., an injection or an avalanche injection condition) in at least one of the junctions defined by regions 43 and 44 and the substrate 40. This will cause electrons to enter and pass through the insulative layer 47 onto the floating gate 42 thereby negatively charging the floating gate. The stored negative charge on the floating gate 42 will induce a permanent inversion layer within the channel 41 thereby causing a conductive path to lead 52 (the base of the transistor). The charging of the floating gate 42 may be prevented by biasing region 43, negatively, or by leaving lead 52 floating. Thus, by selectively coupling lead 52, the bipolar transistor may be selectively programmed. To detect the presence of a charge on the floating gate, current is supplied to the base of the bipolar transistor through lead 52 with lead 53 grounded. If the floating gate is charged, the bipolar transistor will turn on and provide a low impedance path from its collector (lead 54) to ground. If the floating gate is not charged, the bipolar device will not turn on when the same predetermined signal is supplied to said base. The advantage of the electrically programmable bipolar transistor is its high speed operation, which can be implemented in a fast (less than 100 nano sec access time) bipolar read only memory. It should be noted that the combination of a bi-polar transistor and a floating gate storage device such as described hereinabove provides a structure whereby the characteristics of a bipolar transistor may be programmed and individually customed. This has the advantage of enabling the production of numerous identical elements and the electrically altering the characteristic of certain transistors as desired by the storage of a charge in the storage device. It should be appreciated that the storage device hereinabove described is not necessarily a digital device but may store charges proportionate to the input signal supplied to the storage device, that is, the storage device may be regarded as analog in nature as well as digital. The analog nature of the device in combination with the inclusion of a bipolar transistor provides an entirely new concept in the manufacture of customized large scale arrays of solid state components.

It will be obvious that a pnp transistor similar to the transistor illustrated in FIG. 3 may be likewise produced or that other types of material other than silicon may be utilized in the manufacture of such a transistor.

A number of methods have been found for removing the charge from a gate 28 of FIG. 2 or a gate 42 of FIG. 3. If the transistor of FIGS. 2 or 3 are subjected to X-ray radiation, the charge on gates 28 or 42 is removed. Experiments have shown that radiation of $2X10^5$ rads when applied even through the package containing the transistor will cause the charge to 13e removed from gates 28 or 42. Also, ultra-violet light of the order of magnitude 4ev's when applied directly to the transistor (not through the transistor package) will cause the charge to be removed from the gates 28 or 42. Subjecting the transistor to high temperatures (i.e., 450° C) will also cause the charge to be removed, but this technique may result in permanently damaging the device.

Thus, field effect transistors containing a floating gate which is completely surrounded by insulative material such as silicon dioxide, particularly adaptable for use in a read-only memory has been described. The transistor may be manufactured utilizing known semiconductor fabrication techniques. The contacts to the transistor which are used to determine the existence or non-existence of a charge on the gate are also used to place a charge on the gate. Unlike the prior art floating gate field effect transistors, a charging gate is not required and relatively thick easy to develop thermal oxide layers may be used between the floating gate and the substrate.

Figure 4A:
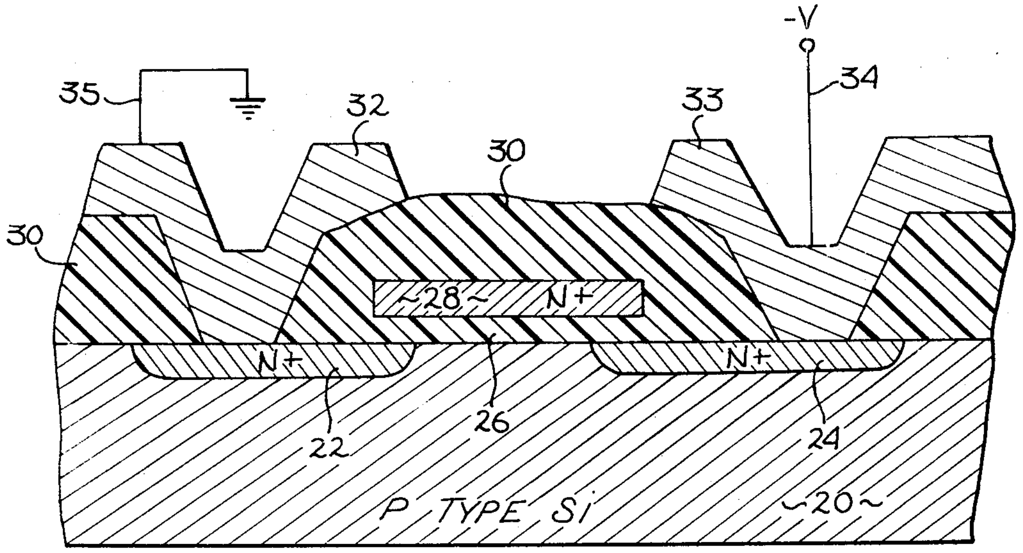
FIG. 4*a* is a cross-sectional view of an alternate embodiment of the present invention employing a p-type substrate.
Figure 4B:
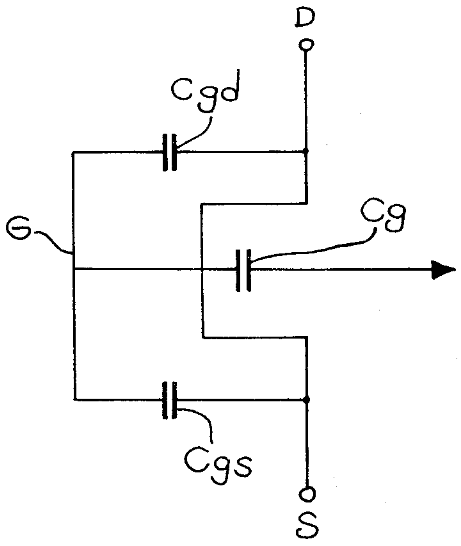
FIG. 4*b* is a schematic showing of the capacitance associated with the source, drain and gates.

The P-channel floating gate storage device described above employs avalanche injection of electrons from a p-n junction to charge the floating gate. A similar *n*-channel storage device is shown in FIG. 4*a*. This device is constructed by the same techniques as those devices previously described and the parts of the device corresponding to parts of the device shown in FIG. 2 and indicated by the same numbers as such parts are indicated in FIG. 2. A device so constructed and employing the same charging technique ($V_D = +V_S = 0$) would require a very high applied voltage ($+V$) to charge the floating gate since the probability of holes being avalanche injected from the N+ type surface depletion region through the oxide is very low. However, by employing a different mode of operation, electrons may be injected from the p-type substrate to the N+ floating gate at a relatively low voltage through a thick oxide (over approximately 500 angstroms). If both source and drain are positively biased simultaneously, a positive voltage ($V_G$) is fed back to the floating gate in accordance with the following relationship:

$$V_G = V\,(C_{gs} + C_{gd})/C_{gs} + C_{gd} + C_g$$

where the capacitances are those shown in FIG. 4*b*. If $V_G$ is of a sufficient magnitude, it induces an avalanche injection condition in the *p*-type substrate, and high energy electrons will be injected across the oxide to the floating gate.

Figure 5:
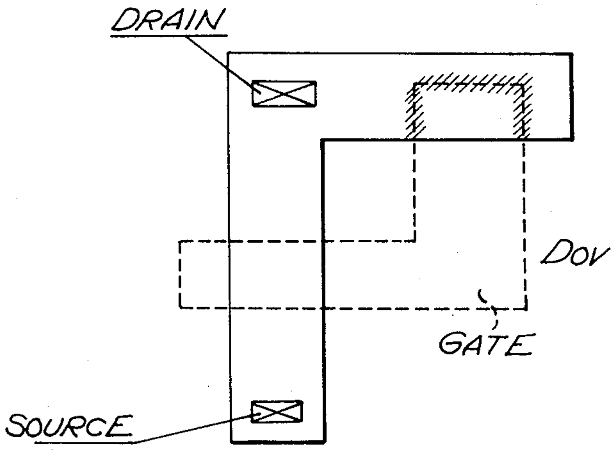
FIG. 5 is a top view of an alternate embodiment of the present invention wherein the gate is configured to obtain increased feedback capacitance.

To attain a maximum positive voltage $V_G$ the capacitance ratio $$C_{gs} + C_{gd}/C_{gs} + C_{gd} + C_g$$

should be maximized. This can be achieved in a number of ways such as by an increase of diffusion time of the N+ region to maximize the N+ region to gate overlap, or by means of the layout as shown in FIG. 5. Here the drain feedback capacitance $C_{gd}$ has been increased by the periphery of the shaded areas. The same technique can be employed to increase source capacitance $C_{gs}$. If only one of the feedback capacitances is increased ($C_{gs}$ or $C_{gd}$), the proper positive feedback voltage to the gate can be obtained by biasing only one of the junctions positively and keeping the other at ground potential. The major difference in the mode of operation of the above described N-channel embodiment from the p-channel counterpart is that electrons are transferred to the floating gate of a P-channel device which shifts the turn on voltage in the negative direction while in the n-channel device, despite the change in applied voltage polarity, electrons are also injected to the floating gate of the n-channel device which shifts the turn on voltage in the positive direction. It should be understood that the gate can be n-type or p-type silicon. Other materials may also fall within the broad scope of the invention.

Figure 6:
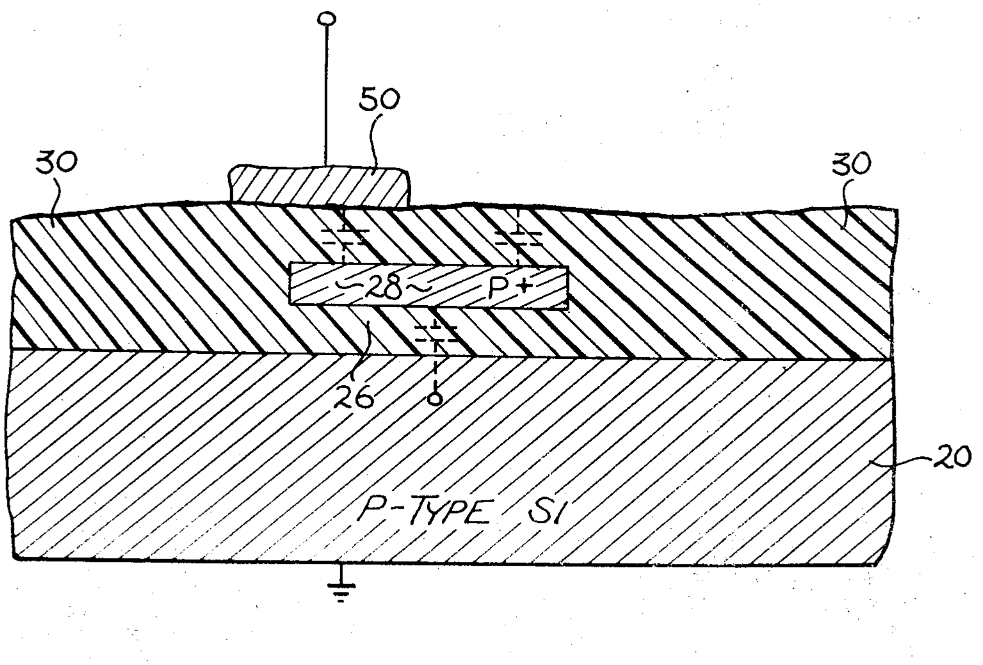
FIG. 6 is a cross-sectional view of an alternate embodiment of the present invention wherein the source and drain have been eliminated.

A final embodiment described in detail herein is shown in FIG. 6. The main semiconductor structural variation in this embodiment when compared to that of FIG. 4 is the elimination of source 22 and drain 24 and the connections thereto and the addition of a gate 50. Otherwise the semiconductor structure of the embodiment of FIG. 4 and FIG. 6 is substantially identical. This variation of the embodiment shown in FIG. 6 is made possible when it is appreciated that the primary function of the source and drain regions is a sensing function which can be performed by other well known devices available for capacitive or charge sensing. The ratio of the capacitances associated with the floating gate and substrate and the capacitance associated with the floating gate and gate 50 should be adjusted such that when a voltage is applied between gate 50 and substrate 20, the majority of the voltage drop will occur between the floating gate and substrate.

A positive voltage pulse of approximately 35 volts applied to metal gate 50 with the substrate 20 grounded will cause the voltage drop to occur primarily across capacitance $C_g$ and cause injection from the p-type substrate to the floating gate 28. Sensing of the charged state of the gate can be accomplished by well known capacitance sensing arrangements which would sense the capacitance variation between gate 50 and ground due to the presence or absence of charge on floating gate 28.

Thus, a method has been disclosed for electrically charging a floating gate. Alternate embodiments of a device which allow the charge to be placed on the gate by the application of a voltage to the source and drain regions or through additional gates has also been illustrated. Certain of the embodiments have the advantage that no current flows between the source and drain regions during the charging of the floating gate. Other embodiments have been shown wherein no source or drain are required.

I claim:

1. A device comprising:

a substrate of a first conductivity type including a first and second spaced apart regions of an opposite conductivity type;

a third region of the first conductivity type disposed within said second region;

a conductive floating gate disposed between said first and second regions; and an insulative means, insulating said gate and separating said gate from said substrate and first and second regions and completely surrounding said floating gate;

said substrate, and said first and third regions forming the terminals of a bipolar transistor and said first and second regions forming part of a field effect device means for avalanching one of the junctions defined by said first and second region and said substrate thereby causing an electrical charge to be transferred onto said floating gate.

2. The device defined in claim 1 wherein said substrate comprises a silicon material.

3. The device defined in claim 2 wherein said insulative means comprises a silicon oxide.

4. The device defined in claim 3 wherein said gate comprises silicon.

5. The device defined in claim 3 wherein said gate comprises aluminum.

6. The device defined in claim 4 wherein said first conductivity type is n-type.

7. The device defined in claim 1 including a fourth region in said substrate having the same conductivity type as said substrate and forming part of the collector of said bipolar transistor, said first region forming the base of said transistor and the third region forming the emitter of said transistor.

8. A programmable memory device comprising:

a substrate of a first conductivity type;

a pair of spaced apart regions of a second conductivity type disposed in said substrate, said spaced apart regions defining a channel;

a floating gate disposed above said channel said gate overlapping one of said regions more than the other of said regions;

insulation means for insulating said floating gate from said substrate, regions and channel;

means for applying a voltage to at least one of said spaced apart regions and said substrate of sufficient magnitude to cause an avalanche injection, thereby causing electrons to pass through said insulation means onto said floating gate whereby said floating gate may be electrically charged.

9. The device defined in claim 8 wherein said substrate is a P-type silicon.

* * * * *